(12) United States Patent
Shigaki

(10) Patent No.: US 6,914,483 B2
(45) Date of Patent: Jul. 5, 2005

(54) HIGH-FREQUENCY AMPLIFIER CIRCUIT (75) Inventor: Masafumi Shigaki, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/916,754

(22) Filed: Aug. 12, 2004

(65) Prior Publication Data
US 2005/0012548 A1 Jan. 20, 2005

Related U.S. Application Data (63) Continuation of application No. PCT/JP02/01881, filed on Feb. 28, 2002.

(51) Int. Cl.[7] .............................................. H03G 3/20
(52) U.S. Cl. ...................................... 330/136; 330/129
(58) Field of Search ................................. 330/136, 129, 330/279, 285, 296

(56) References Cited

U.S. PATENT DOCUMENTS

| | | | | |
|---|---|---|---|---|
| 5,532,646 | A | * | 7/1996 | Aihara ........................ 330/279 |
| 6,710,649 | B2 | * | 3/2004 | Matsumoto et al. ..... 330/124 R |
| 6,791,418 | B2 | * | 9/2004 | Luo et al. .................... 330/296 |
| 6,822,517 | B2 | * | 11/2004 | Matsumoto et al. ........ 330/295 |

FOREIGN PATENT DOCUMENTS

| | | |
|---|---|---|
| JP | 55-11225 | 1/1980 |
| JP | 62-167416 | 7/1987 |
| JP | 2-149108 | 6/1990 |
| JP | 5-347514 | 12/1993 |
| JP | 7-288433 | 10/1995 |
| JP | 11-261343 | 9/1999 |
| JP | 2001-358540 | 12/2001 |

OTHER PUBLICATIONS

Internation Search Report dated Jun. 11, 2002.

* cited by examiner

Primary Examiner—Henry Choe
(74) Attorney, Agent, or Firm—Katten Muchin Zavis Rosenman

(57) ABSTRACT

A signal is sampled at a stage following a first amplifier circuit (12, 14, 16) and preceding a second amplifier circuit (20, 22), and the presence or absence of a signal is detected by a detector circuit (30). When the presence of a signal is detected, a gate bias circuit (32) switches a gate bias for FETs in the second amplifier circuit (20, 22) to a normal operating voltage value, and when the signal is no longer detected, the gate bias is switched to a voltage value that reduces power consumption, after a mask time has elapsed. In a distortion feedback-type high-frequency amplifier circuit, a means for cutting off a circuit portion for the adjustment of each of a distortion extracting circuit and an inverse distortion adding circuit is achieved by switching FET gate voltage so as to put the corresponding amplifier in a virtually cutoff condition.

2 Claims, 7 Drawing Sheets

HIGH-FREQUENCY AMPLIFIER CIRCUIT

CROSS REFERENCE TO RELATED APPLICATION

This application is a continuation of PCT/JP02/01881, filed on Feb. 28, 2002.

TECHNICAL FIELD

The present invention relates to a high-frequency amplifier circuit for amplifying signals input in bursts, a high-frequency amplifier circuit having a function for canceling distortion by feedback, and a high-frequency amplifier circuit having a plurality of amplifiers in parallel as in a feedforward amplifier.

BACKGROUND ART

In a high-frequency amplifier circuit for amplifying incoming burst signals, if power consumption of the amplifier circuit, especially, a field-effect transistor (FET) used as an amplifying element, can be suppressed between bursts when no signal is present and amplification is therefore not necessary, the power consumption of the circuit as a whole can be drastically reduced.

In view of this, Japanese Unexamined Patent Publication No. H05-347514 describes a method in which the presence or absence of a signal is detected at the input of the amplifier circuit and, if no signal is detected, the bias to the gate terminal of the FET is set deeper to reduce power consumption.

However, the method of detecting the presence or absence of a signal at the input of the amplifier circuit involves the problem that the presence or absence of a signal cannot be detected properly if the signal to be detected is very weak.

A high-frequency amplifier circuit having a function for canceling distortion by feedback (a distortion feedback-type amplifier circuit) is described, for example, in Japanese Unexamined Patent Publication No. H05-167356 or 2001-358540. In this type of amplifier circuit, a distortion component is generated by combining a portion of the input to the main amplifier and a portion of the output in opposite phase and equal amplitude relative to the main signal (a distortion extracting circuit), and the distortion component is fed back to the input of the main amplifier in a negative feedback loop (an inverse distortion adding circuit), to achieve a distortion-free amplification.

In the distortion feedback-type amplifier circuit, it is desired that the phase and the power level be preadjustable in the distortion extracting circuit and the inverse distortion adding circuit.

It is also known to provide a high-frequency amplifier circuit having a function for canceling distortion through feedforward control (a feedforward-type amplifier circuit). In the feedforward-type amplifier circuit, as the main amplifier and the auxiliary amplifier for amplifying the distortion component are used in parallel, the characteristics of each individual amplifier, once mounted, cannot be measured. This is also true of an adaptive-type amplifier array or a phased-array type amplifier in which a plurality of amplifiers are used in parallel; that is, the characteristics of each individual amplifier, once mounted, cannot be measured. Therefore, for this type of circuit, it is desired to enable the characteristics of each individual amplifier to be measured even after mounting.

DISCLOSURE OF THE INVENTION

Accordingly, a first object of the present invention is to provide a high-frequency amplifier circuit in which power consumption can be controlled even when the burst input is very weak.

A second object of the present invention is to provide a distortion feedback-type high-frequency amplifier circuit in which the phase and the power level of the distortion extracting circuit and the inverse distortion adding circuit can be adjusted accurately and in a simple manner.

A third object of the present invention is to provide a high-frequency amplifier circuit in which the characteristics of each individual amplifier can be measured even after mounting.

According to the present invention, there is provided a high-frequency amplifier circuit comprising: a first amplifier circuit; a second amplifier circuit, containing at least one field-effect transistor, for amplifying an output of the first amplifier circuit; a detector circuit which detects a signal from the output of the first amplifier circuit; and a control circuit which, when no signal is detected by the detector circuit, sets a gate bias for the field-effect transistor contained in the second amplifier circuit to a voltage value that reduces power consumption of the field-effect transistor.

According to the present invention, there is also provided a high-frequency amplifier circuit comprising: a first amplifier circuit containing a first field-effect transistor; a first combining circuit for combining a portion of an input to the first amplifier circuit and a portion of an output from the first amplifier circuit in opposite phase and equal amplitude relative to a main signal and, thereby, generating a distortion component due to the first amplifier circuit; a first phase/power-level adjusting circuit for adjusting phase and power level of either one of or both of the portion of the input to the first amplifier circuit and the portion of the output from the first amplifier circuit so that the portions will be combined in the first combining circuit in opposite phase and equal amplitude relative to the main signal; a second amplifier circuit, containing a second field-effect transistor, for amplifying the output of the first combining circuit; a second combining circuit for combining the output of the second amplifier circuit with the input to the first amplifier circuit so as to provide negative feedback of the distortion component; a second phase/power-level adjusting circuit for adjusting the phase and the power level of the output of the first combining circuit so as to provide negative feedback of the distortion component in the second combining circuit; and a control circuit which, when adjusting the first phase/power-level adjusting circuit, sets a gate bias for the second field-effect transistor to a voltage value that suppresses the output of the second field-effect transistor and, when adjusting the second phase/power-level adjusting circuit, sets a gate bias for the first field-effect transistor to a voltage value that suppresses the output of the first field-effect transistor.

According to the present invention, there is also provided a high-frequency amplifier circuit comprising: a first amplifier circuit containing a first field-effect transistor; a first combining circuit for combining a portion of an input to the first amplifier circuit and a portion of an output from the first amplifier circuit in opposite phase and equal amplitude relative to a main signal, and thereby generating a distortion component due to the first amplifier circuit; a first phase/power-level adjusting circuit for adjusting phase and power level of either one of or both of the portion of the input to the first amplifier circuit and the portion of the output from the first amplifier circuit so that the portions will be combined in the first combining circuit in opposite phase and equal amplitude relative to the main signal; a second amplifier circuit, containing a second field-effect transistor, for amplifying the output of the first combining circuit; a second combining circuit for combining the output of the second amplifier circuit with the input to the first amplifier circuit so as to provide negative feedback of the distortion component; a second phase/power-level adjusting circuit for adjusting the phase and the power level of the output of the first combining circuit so as to provide negative feedback of the distortion component in the second combining circuit; a third amplifier circuit, containing a third field-effect transistor, for amplifying the portion of the input to the first amplifier circuit which is combined in the first combining circuit; and a control circuit which, when adjusting the first phase/power-level adjusting circuit, sets a gate bias for the second field-effect transistor to a voltage value that suppresses the output of the second field-effect transistor and, when adjusting the second phase/power-level adjusting circuit, sets a gate bias for the third field-effect transistor to a voltage value that suppresses the output of the third field-effect transistor.

According to the present invention, there is also provided a high-frequency amplifier circuit comprising: a first amplifier circuit containing a first field-effect transistor; a first combining circuit which generates a distortion component by combining a portion of an input to the first amplifier circuit and a portion of an output from the first amplifier circuit in opposite phase and equal amplitude relative to a main signal; a second amplifier circuit, containing a second field-effect transistor, for amplifying the output of the first combining circuit; a second combining circuit which combines the output of the second amplifier circuit with the output from the first amplifier circuit in opposite phase and equal amplitude relative to the distortion component; and a control circuit which, when measuring characteristics of the first amplifier circuit, sets a gate bias for the second field-effect transistor to a voltage value that suppresses the output of the second field-effect transistor and, when measuring characteristics of the second amplifier circuit, sets a gate bias for the first field-effect transistor to a voltage value that suppresses the output of the first field-effect transistor.

According to the present invention, there is also provided a high-frequency amplifier circuit comprising: a plurality of phase shifters; a plurality of amplifier circuits, each containing a field-effect transistor and connected in series to a corresponding one of the plurality of phase shifters; and a control circuit capable of setting a gate bias for selected ones of the field-effect transistors to a voltage value that suppresses outputs of the selected ones of the field-effect transistors.

BEST MODE FOR CARRYING OUT THE INVENTION

Figure 1:
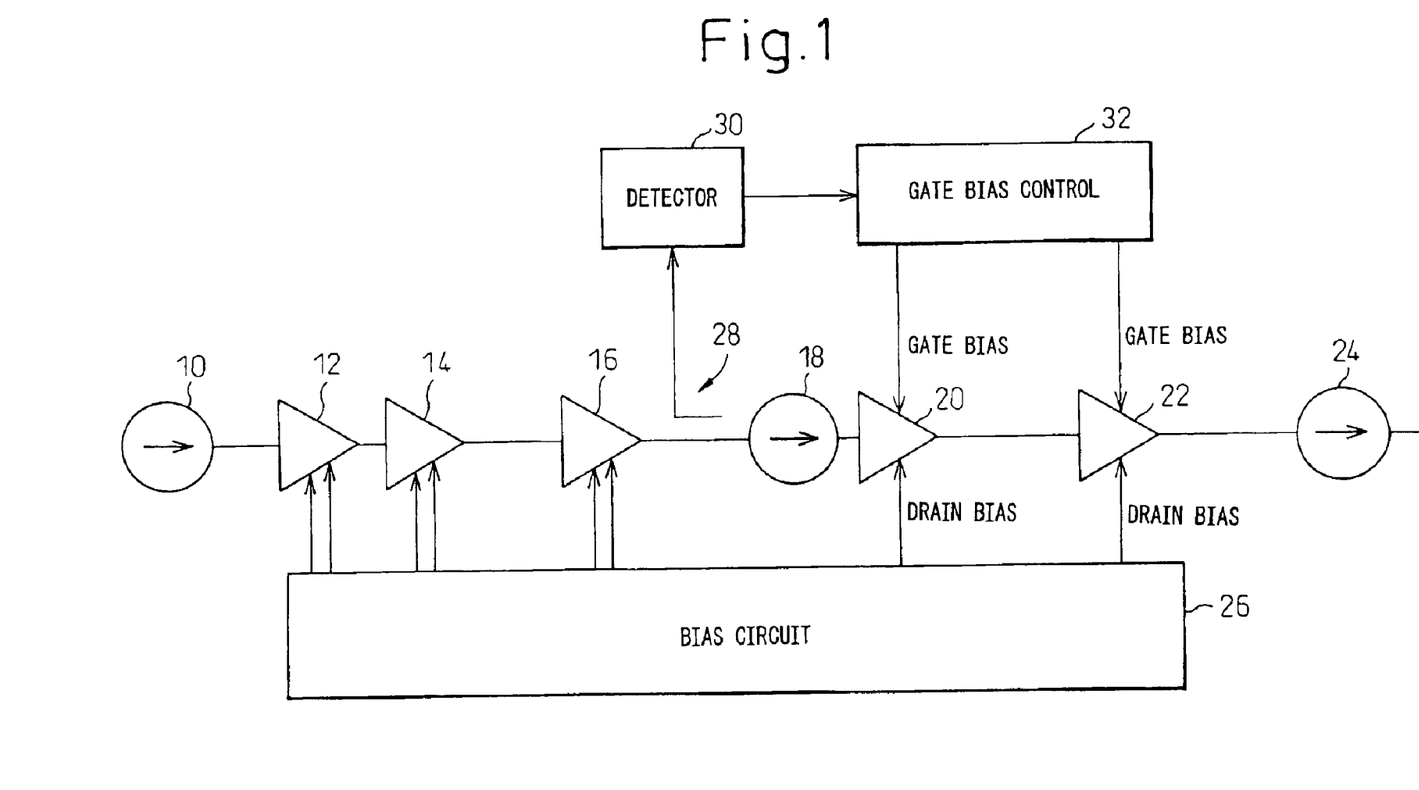
FIG. 1 is a block diagram showing the configuration of a high-frequency amplifier circuit according to a first embodiment of the present invention.

FIG. 1 is a block diagram showing the configuration of a high-frequency amplifier circuit according to a first embodiment of the present invention. A signal input via an isolator 10 at the input side is successively amplified by amplifiers 12, 14, and 16, and the amplified signal is fed via an isolator 18 to amplifiers 20 and 22 for amplification, and output via an isolator 24 provided at the output side. The amplifiers 12, 14, 16, 20, and 22 are each constructed from a field-effect transistor (FET). The drain terminals of all the FETs and the gate terminals of the amplifiers 12, 14, and 16 are supplied with a fixed bias from a bias circuit 26.

A portion of the signal amplified by the amplifiers 12, 14, and 16 is separated by a coupler 28 and supplied to a detector circuit 30 which detects the presence or absence of a signal. When the presence of a signal is detected by the detector circuit 30, a gate bias control circuit 32 instantly switches the gate bias for the amplifier circuits 20 and 22 to a normal operating voltage, for example, a voltage of about −5 V. When the signal is no longer detected, the gate bias is switched, for example, to about −10 V after a predetermined length of time, thus reducing the drain currents of the amplifiers 20 and 22 to reduce the power consumption. The power consumption of the amplifiers 12, 14, and 16 is inherently small, and it contributes little to the reduction of the overall power consumption if their gate voltages are adjusted.

Figure 2:
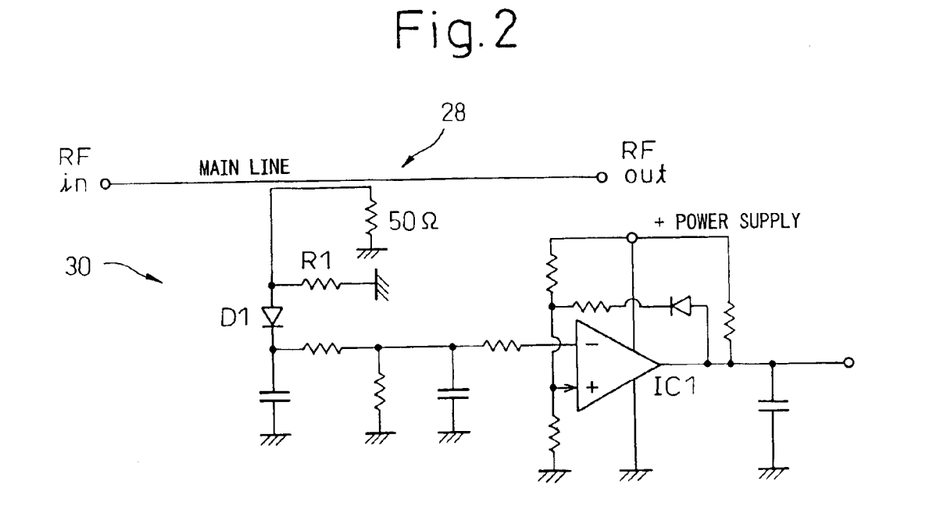
FIG. 2 is a circuit diagram depicting the details of a detector circuit 30 shown in FIG. 1.

FIG. 2 shows the details of the coupler 28 and the detector circuit 30 used in FIG. 1. A portion of the output of the amplifier 16 (FIG. 1) is separated by the coupler 28. The separated signal is rectified by a diode D1, smoothed by resistors and capacitors, and input to a comparator comprising an IC 1, where it is compared with a reference voltage. The input voltage to the IC 1 increases as the output power level of the amplifier 16 increases. When the input voltage increases above the reference voltage of the IC 1, the output of the IC 1 becomes 0 V. On the other hand, when the output power level of the amplifier 16 decreases, and the input voltage to the IC 1 drops below the reference voltage, the output of the IC 1 becomes open.

Figure 3:
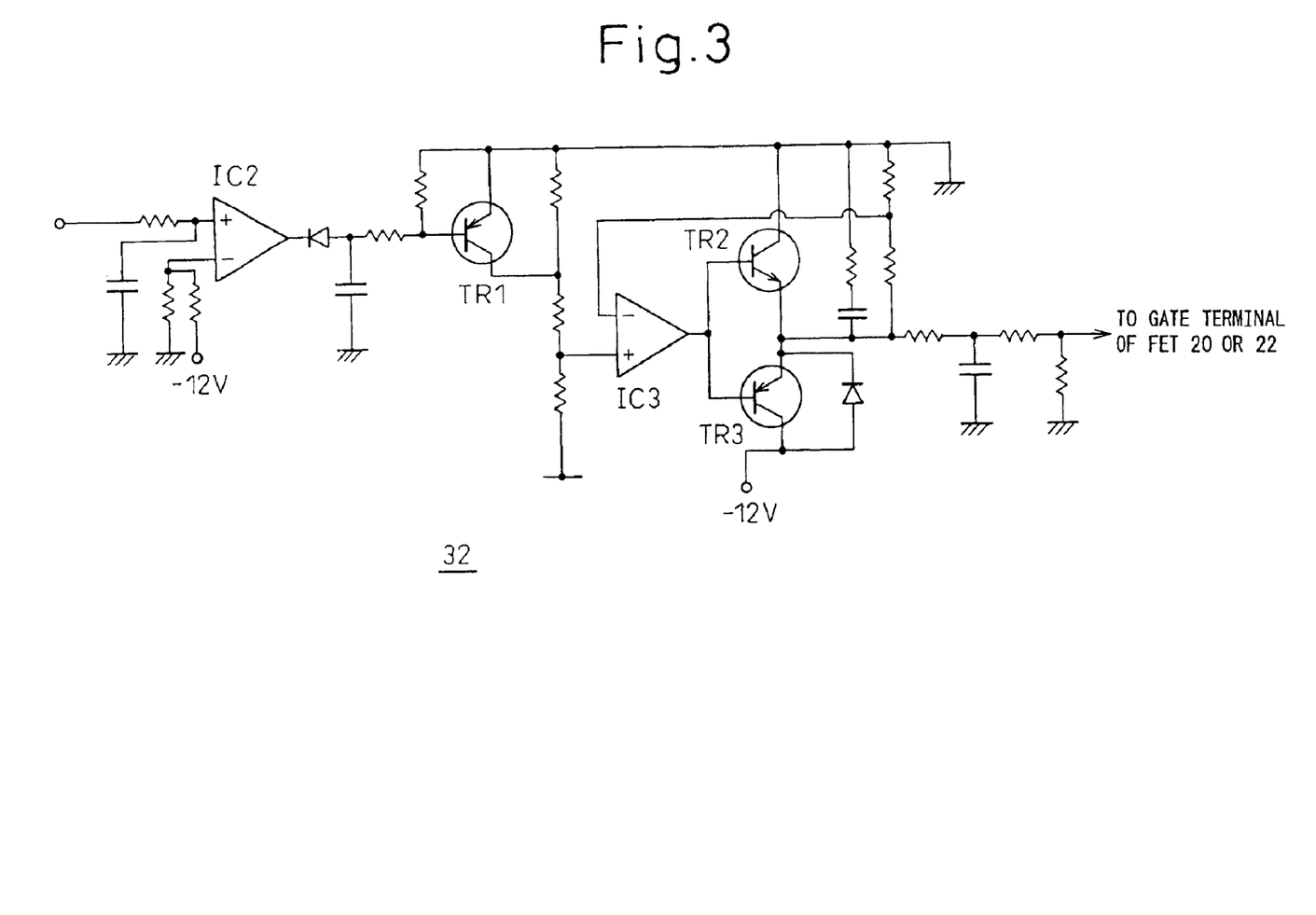
FIG. 3 is a circuit diagram depicting the details of a gate bias control circuit shown in FIG. 1.

FIG. 3 shows the details of the gate bias control circuit 32 used in FIG. 1. When the presence of a signal is detected by the detector circuit 30, and its output becomes 0 V, as described above, an IC 2 acting as a comparator outputs −12 V, which causes a TR 1 to turn on. As a result, the absolute value of a reference voltage (positive input) to an IC 3 acting as an amplifier decreases, and the absolute value of the output of the IC 3 also decreases so as to reduce the absolute value of the output of the circuit. With this operation, the circuit produces an output voltage of −5 V, thus supplying a stable voltage to the load. This puts the FETs 20 and 22 (FIG. 1) in a normal operating condition. On the other hand, when the signal is no longer detected by the detector circuit 30, and its output becomes open, then the output of the IC 2 becomes open, and the TR 1 is turned off after a mask time has elapsed. As a result, the absolute value of the reference voltage to the IC 3 increases, and the absolute value of the output of the IC 3 also increase so as to increase the absolute value of the output of the circuit. With this operation, the output of the control circuit 32 switches to −10 V, thus supplying a stable voltage to the load. This greatly reduces the power consumption of the FETs 20 and 22.

Figure 4:
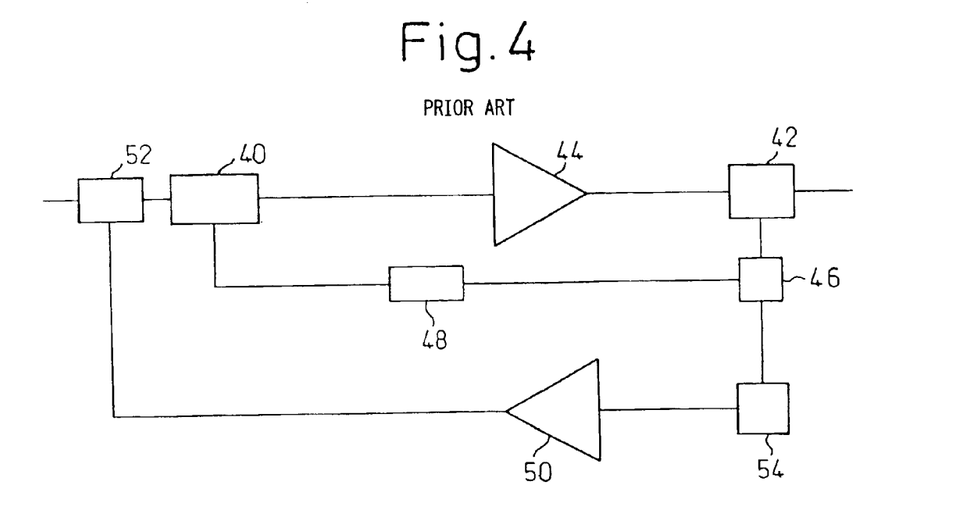
FIG. 4 is a block diagram showing the configuration of a distortion feedback-type high-frequency amplifier circuit.

FIG. 4 shows the configuration of a prior art distortion feedback-type amplifier. A portion of an input signal to a main amplifier 44, and a portion of an output signal from it, are separated by couplers 40 and 42, respectively. After adjusting the signal phase and power level by a phase/power-level adjuster 48, the signals are combined by a coupler 46 in such a manner as to be opposite in phase but equal in amplitude with respect to the main signal, and thus only a distortion component is extracted from the coupler 46. The distortion component is amplified by an amplifier 50 and combined, by a coupler 52, with the main signal. By adjusting the phase and power level in a phase/power-level adjuster 54 so as to provide negative feedback of the distortion component, the distortion component occurring in the amplifier 44 is suppressed.

Figure 5:
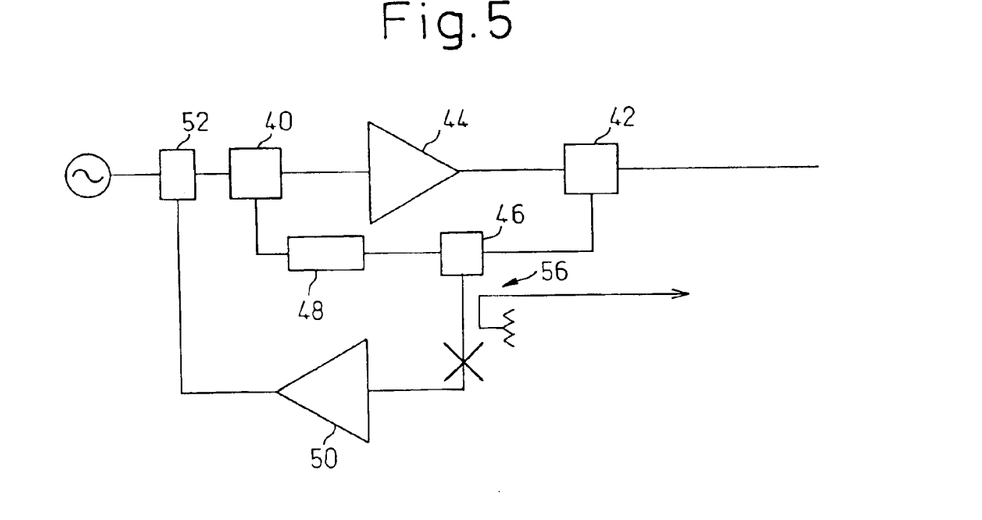
FIG. 5 is a diagram conceptually showing a technique for optimization of a distortion extracting circuit in the distortion feedback-type high-frequency amplifier circuit.

FIG. 5 conceptually shows a technique for adjustment of the phase/power-level adjuster 48 according to the present invention. The path leading from the coupler 46 to the coupler 52 via the amplifier 50 is actually or virtually cut off by using a suitable means; in this condition, a CW signal of target frequency (operating frequency) is applied to the input, and a portion of the output of the coupler 46 is extracted by a coupler 56 to measure its power level. The distortion extracting circuit is optimized by adjusting the phase and level of the phase/power-level adjuster 48 so as to minimize the measured level. In an adjustment procedure, for example, the amount of attenuation is held fixed, and the amount of phase shift is varied to search for the amount of phase shift where the level is minimum. Next, while holding the amount of phase shift fixed to the thus determined value, the amount of attenuation is varied to search for the amount of attenuation where the level is minimum. The optimum amount of phase shift and the optimum amount of attenuation can be determined by repeating this procedure several times.

Figure 6:
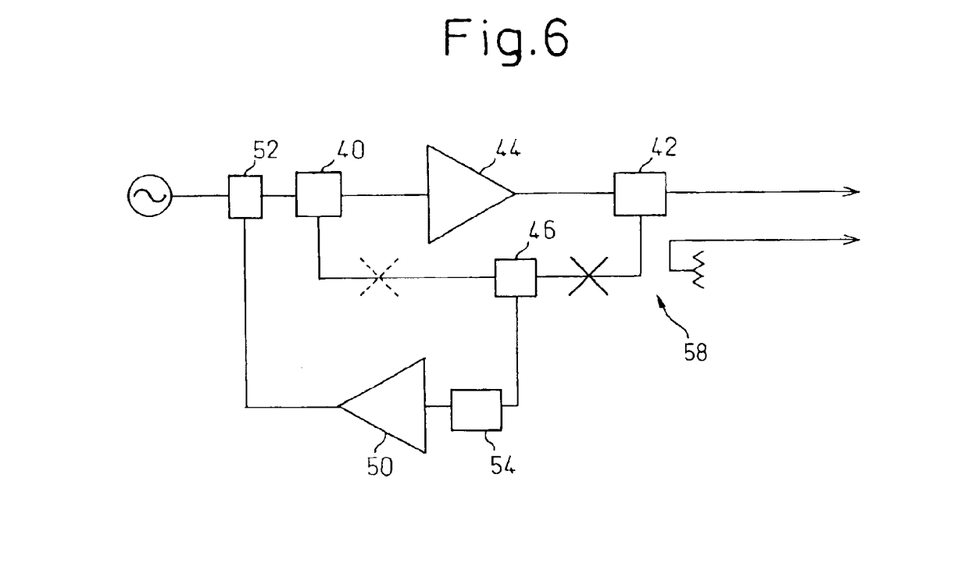
FIG. 6 is a diagram conceptually showing a technique for optimization of an inverse distortion adding circuit in the distortion feedback-type high-frequency amplifier circuit.

For the adjustment of the phase/power-level adjuster 54, the path leading from the coupler 40 via the amplifier 44 and the coupler 42 to the coupler 46 is actually or virtually cut off by using a suitable means as shown by X in FIG. 6; in this condition, a CW signal is applied to the input, and a portion of the signal separated by the coupler 42 is extracted by a coupler 58 to measure its power level. Instead of measuring the signal separated by the coupler 42, the main signal output of the coupler 42 may be measured. The inverse distortion adding circuit is optimized by adjusting the phase/power-level adjuster 54 so as to maximize the measured level. An adjustment procedure, similar to the one employed for the phase/power-level adjuster 48, can be used here.

Instead of disconnecting the path leading from the coupler 40 to the coupler 46 via the amplifier 44, the path leading from the coupler 40 to the coupler 46 without passing through the amplifier 44 may be disconnected as shown by dashed X in FIG. 6. In this case, the adjustment is performed so as to minimize the power level of the signal separated by the coupler 58.

According to the above method, the phase and the power level can be optimized in a simple manner by just monitoring the level.

Figure 7:
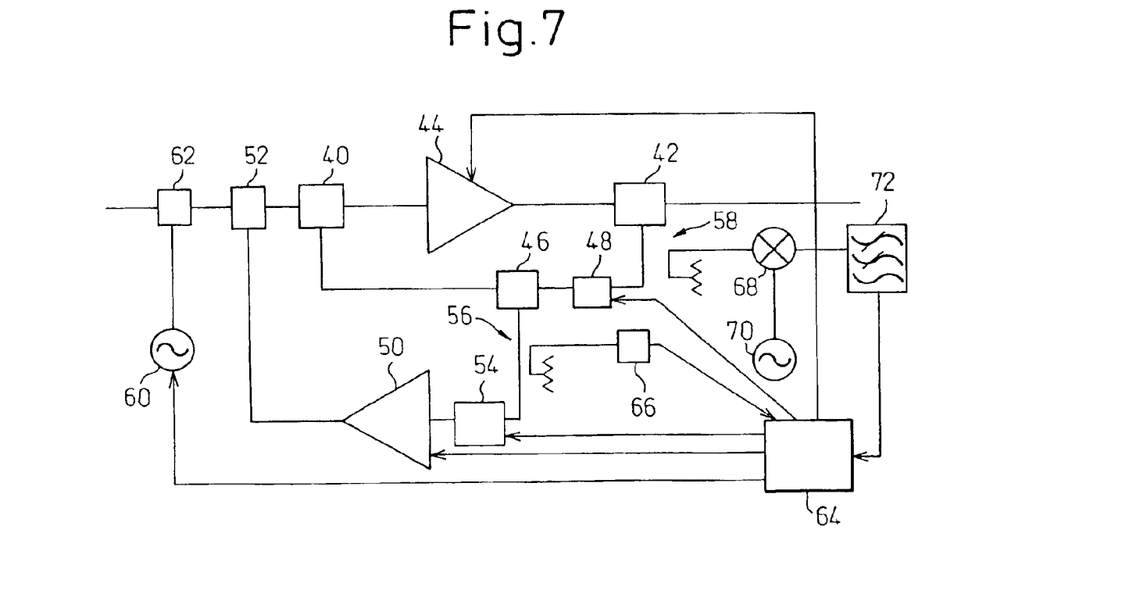
FIG. 7 is a block diagram showing the configuration of a distortion feedback-type high-frequency amplifier circuit having an automatic adjustment function according to a second embodiment of the present invention.

In a second embodiment of the present invention, the actual or virtual cutting off of a portion of the circuit in the above-described method is accomplished by switching the gate bias of an FET used as an amplifier to a voltage value that sufficiently suppresses the output of the FET, for example, to −10, V as previously described. FIG. 7 shows the configuration of a distortion feedback-type high-frequency amplifier circuit having an automatic adjustment function according to the second embodiment of the present invention. The same constituent elements as those in FIGS. 4 to 6 are designated by the same reference numerals, and a description of such elements will not be repeated here.

In FIG. 7, the CW signal for adjustment is generated by an oscillator 60, which can be controlled on and off from a control circuit 64, and is input via a coupler 62. The signal extracted by the coupler 56 is converted into a voltage signal representing the power level by a monitor circuit 66 comprising a detecting device such as a diode, and the voltage signal is input to the control circuit 64. The signal extracted by the coupler 58 is frequency-converted by a mixer 68, and is thereafter input to the control circuit 64 via a low-pass filter 72. Here, the frequency conversion by the mixer 68 and the signal detection by the low-pass filter 72 are necessary in order to extract only the distortion component during operation; if the purpose is to be limited to the adjustment prior to operation, the signal may be processed in the same manner as the signal extracted by the coupler 56.

The amount of attenuation and the amount of phase shift in each of the phase/power-level adjusters 48 and 54 can be changed by changing the value of the voltage supplied from the control circuit 64. The amplifiers 44 and 50 are each constructed from one or a plurality of stages of FETs, and switching between the normal operation and the virtually cutoff condition can be accomplished by changing the gate voltage of one or more of the FETs using the control circuit 64.

Figure 8:
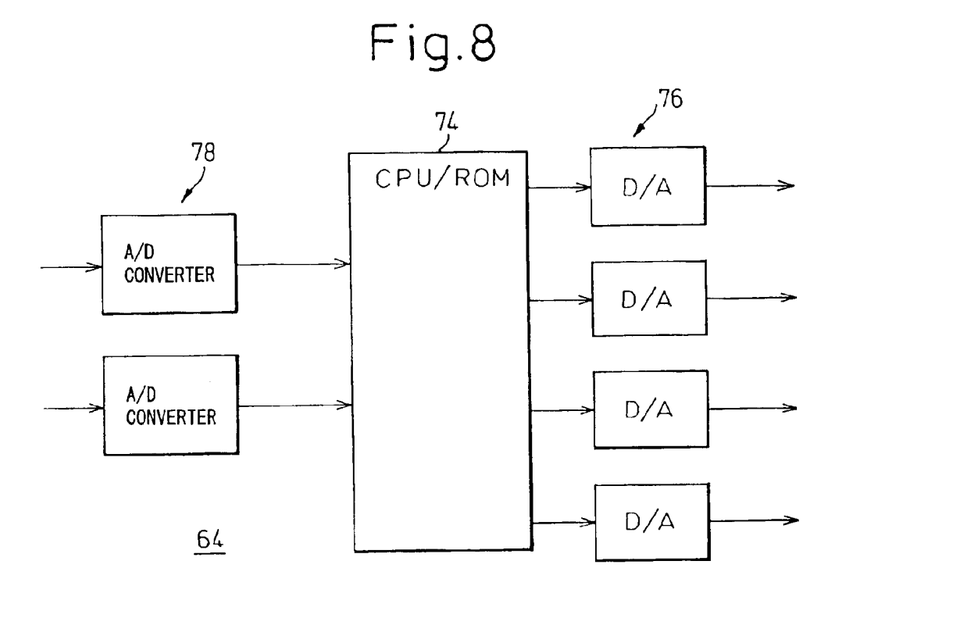
FIG. 8 is a circuit diagram depicting the details of a control circuit 64 shown in FIG. 7.

FIG. 8 shows one example of the detailed configuration of the control circuit 64. A CPU/ROM 74, in accordance with programs stored therein, controls the oscillator 60 on and off by using the above method, sets the gate voltages of the amplifiers 44 and 50 via D/A converters 76, receives the measured values of the power levels via A/D converters 78, and appropriately sets the amount of attenuation and the amount of phase shift in the phase/power-level adjusters 48 and 54, via D/A converters 76, in accordance with the results of the measurements.

Figure 9:
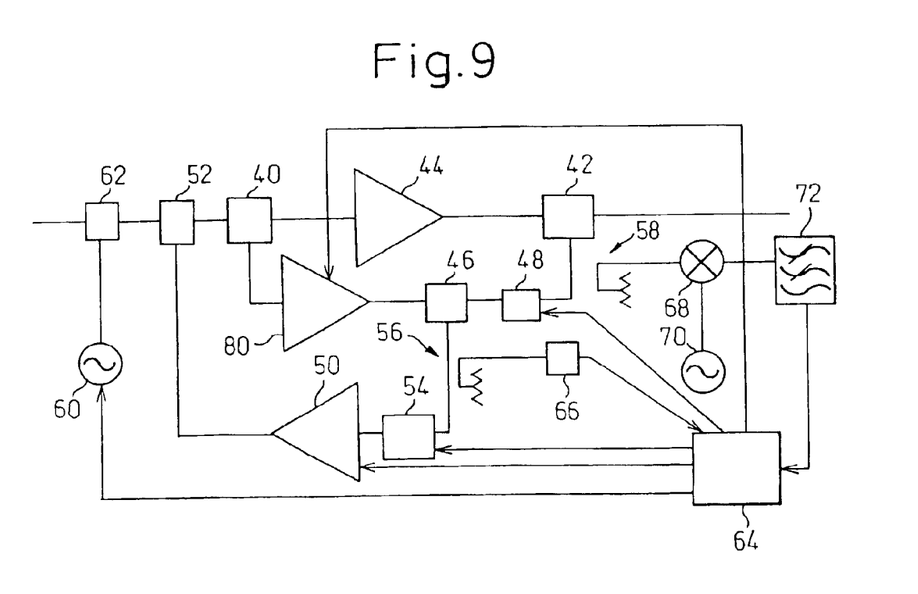
FIG. 9 is a block diagram showing a modified example of the circuit of FIG. 7.

FIG. 9 shows one modified example of the circuit of FIG. 7. In FIG. 9, an amplifier 80 is provided between the couplers 40 and 46. In this example, the virtual cutoff is accomplished by changing the gate voltage of the amplifier 80 rather than changing the gate voltage of the amplifier 44. In this case, as the phase is inverted, the adjustment is performed so as to minimize the measured level.

Figure 10:
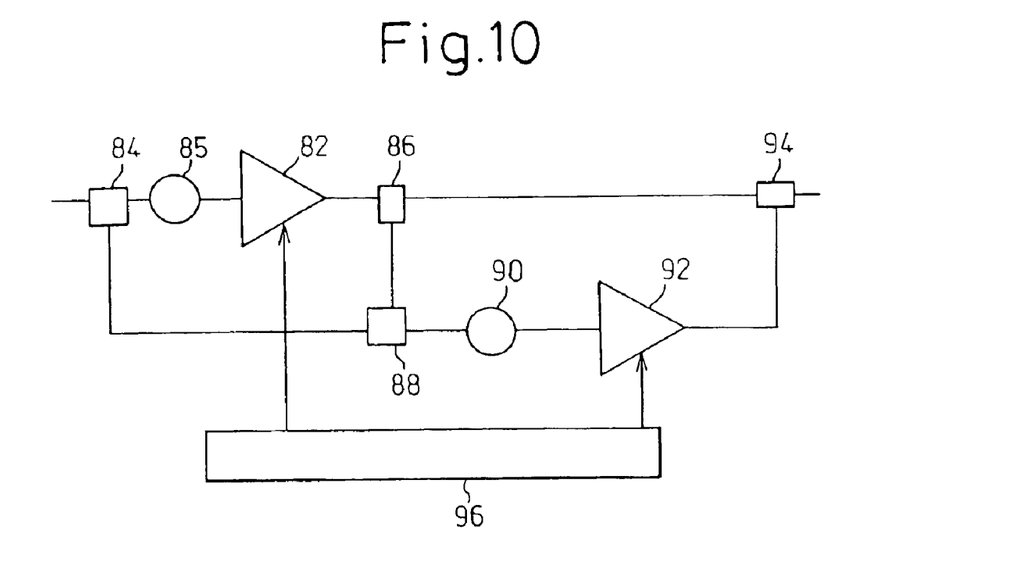
FIG. 10 is a block diagram of a feedforward-type high-frequency amplifier, according to a third embodiment of the present invention, in which the characteristics of each individual amplifier can be measured.

FIG. 10 shows the configuration of a feedforward-type amplifier, according to a third embodiment of the present invention, in which the characteristics of each individual amplifier can be measured even after mounting.

As is well known, in the feedforward-type amplifier, a portion of an input signal to a main amplifier 82 and a portion of an output signal from it are separated by couplers 84 and 86, respectively, and distortion is detected by combining them in a coupler 88 in such a manner as to be opposite in phase but equal in amplitude with respect to the main signal. The detected distortion is then amplified by an auxiliary amplifier 92, and combined in a coupler 94 in such a manner as to be opposite in phase but equal in amplitude with respect to the distortion signal, thereby eliminating the distortion.

A control circuit 96 can switch the gate bias of each individual one of the amplifiers 82 and 92 from the normal operating gate bias, for example, −5 V as previously described, to the virtual cutoff gate bias, for example, −10 V. When the amplifier 82 is put in a virtually cutoff condition, the characteristics of the amplifier 92 can be measured at the output of the circuit even after mounting, and when the amplifier 92 is put in a cutoff condition, the characteristics of the amplifier 82 can be measured even after mounting.

Figure 11:
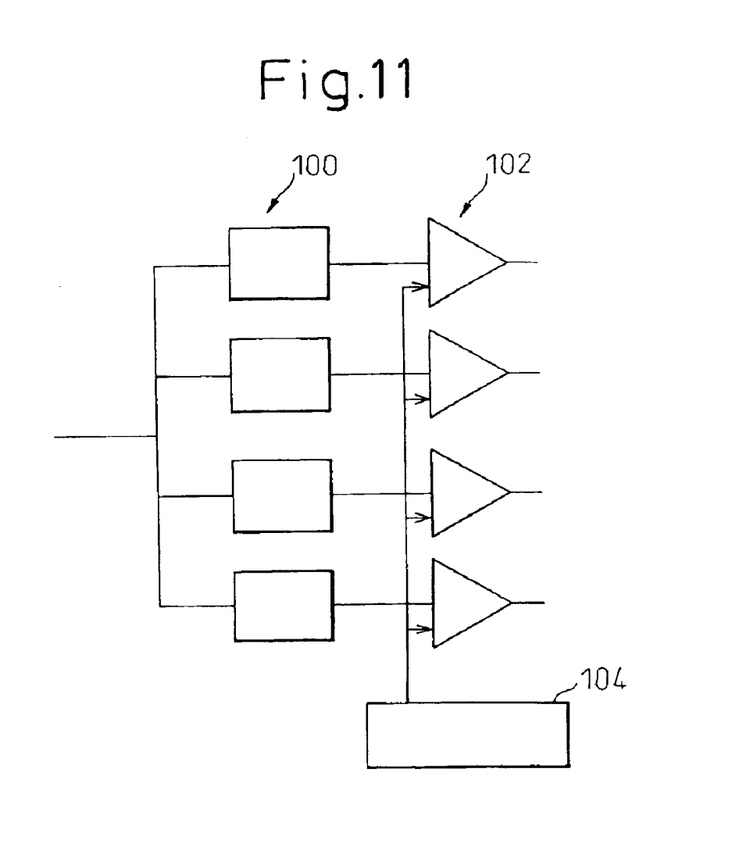
FIG. 11 is a block diagram of a phased-array or adaptive array type amplifier, according to a fourth embodiment of the present invention, in which the characteristics of each individual amplifier can be measured.

FIG. 11 shows the configuration of a phased-array or adaptive array type amplifier, according to a fourth embodiment of the present invention, in which the characteristics of each individual amplifier can be measured even after mounting. In FIG. 11, reference numeral 100 indicates phase shifters, and 102 represents amplifiers. The phase/level characteristics of each individual amplifier can be measured by applying gate biases from a control circuit 104 to the respective amplifiers 102 so as to put only one of the amplifiers in an operating condition.

What is claimed is:

1. A high-frequency amplifier circuit comprising:

a first amplifier circuit;

a second amplifier circuit, containing at least one field-effect transistor, for amplifying an output of the first amplifier circuit;

a detector circuit which detects a signal from the output of the first amplifier circuit; and a control circuit which, when no signal is detected by the detector circuit, switches a gate bias for the field-effect transistor contained in the second amplifier circuit from a first predetermined voltage value at a normal operating level to a second predetermined voltage value at a level that reduces the power consumption of the field-effect transistor.

2. A high-frequency amplifier circuit according to claim 1, wherein the second amplified circuit contains a plurality of field-effect transistors, and the control circuit sets the gate bias for the plurality of field-effect transistors.

* * * * *